US008946029B2

(12) United States Patent
Wong et al.

(10) Patent No.: US 8,946,029 B2
(45) Date of Patent: Feb. 3, 2015

(54) METHODS OF MANUFACTURING INTEGRATED CIRCUITS HAVING FINFET STRUCTURES WITH EPITAXIALLY FORMED SOURCE/DRAIN REGIONS (71) Applicant: GLOBALFOUNDRIES, Inc., Grand Cayman, KY (US)

(72) Inventors: Hoong Shing Wong, Clifton Park, NY (US); Min-hwa Chi, Malta, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 117 days.

(21) Appl. No.: 13/674,142

(22) Filed: Nov. 12, 2012

(65) Prior Publication Data
US 2014/0134814 A1    May 15, 2014

(51) Int. Cl.
H01L 29/78    (2006.01)
(52) U.S. Cl.
CPC ..................................... *H01L 29/78* (2013.01)
USPC .... 438/283; 438/702; 438/478; 257/E21.158; 257/E21.409
(58) Field of Classification Search
CPC ....................................................... H01L 29/78
USPC .......... 438/151, 283–289, 300, 700, 702, 478
See application file for complete search history.

(56) References Cited

U.S. PATENT DOCUMENTS

| 7,329,580 | B2 * | 2/2008 | Choi et al. | 438/257 |
| 2009/0026505 | A1 * | 1/2009 | Okano | 257/255 |
| 2010/0224943 | A1 * | 9/2010 | Kawasaki | 257/390 |
| 2011/0171805 | A1 * | 7/2011 | Yu et al. | 438/303 |
| 2011/0210404 | A1 * | 9/2011 | Su et al. | 257/401 |
| 2014/0065782 | A1 * | 3/2014 | Lu et al. | 438/294 |

OTHER PUBLICATIONS

M.-K. leong, V. Narayanan, D. Singh, A. Topol, V. Chan, and Z. Ren, "Transistor scaling with novel Materials," Materialstoday, vol. 9, pp. 26-31, Jun. 2006.
Intel Technology Journal, vol. 12, pp. 79, issue 2, Jun. 2008.
B. J. Ginsberg, J. Burghartz, G. B. Bronner, and S. R. Mader, "Selective epitaxial growth of Si and some potential applications", IBM J. Res. Develop. v.34, No. 6, p. 816, 1990.
C. Auth, et.al. "A 22nm high performance and low power CMOS technology featuring fully depleted tri-gate transistors, self-aligned contact, and high density MIM capacitors", VLSI technology, 2012.

* cited by examiner

*Primary Examiner* — Savitr Mulpuri
(74) *Attorney, Agent, or Firm* — Ingrassia Fisher & Lorenz, P.C.

(57) ABSTRACT

Methods of manufacturing semiconductor integrated circuits having FinFET structures with epitaxially formed source and drain regions are disclosed. For example, a method of fabricating an integrated circuit includes forming a plurality of silicon fin structures on a semiconductor substrate, forming disposable spacers on vertical sidewalls of the fin structures, and depositing a silicon oxide material over the fins and over the disposable spacers. The method further includes anisotropically etching at least one of the fin structures and the disposable spacers on the sidewalls of the at least one fin structure, thereby leaving a void in the silicon oxide material, and etching the silicon oxide material and the disposable spacers from at least one other of the fin structures, while leaving the at least one other fin structure un-etched. Still further, the method includes epitaxially growing a silicon material in the void and on the un-etched fin structure. An un-merged source/drain region is formed in the void and a merged source/drain region is formed on the un-etched fin structure.

7 Claims, 12 Drawing Sheets

METHODS OF MANUFACTURING INTEGRATED CIRCUITS HAVING FINFET STRUCTURES WITH EPITAXIALLY FORMED SOURCE/DRAIN REGIONS

TECHNICAL FIELD

The present invention generally relates to methods for fabricating semiconductor devices, and more particularly relates to methods of manufacturing semiconductor integrated circuits having FinFET structures with epitaxially formed source and drain regions.

BACKGROUND

In contrast to traditional planar metal-oxide-semiconductor field-effect transistors (MOSFETs), which are fabricated using conventional lithographic fabrication methods, non-planar FETs incorporate various vertical transistor structures. One such transistor structure is the "FinFET," which takes its name from the multiple thin silicon "fins" that are used to form the respective gate channels, and which are typically on the order of tens of nanometers in width.

Figure 1:
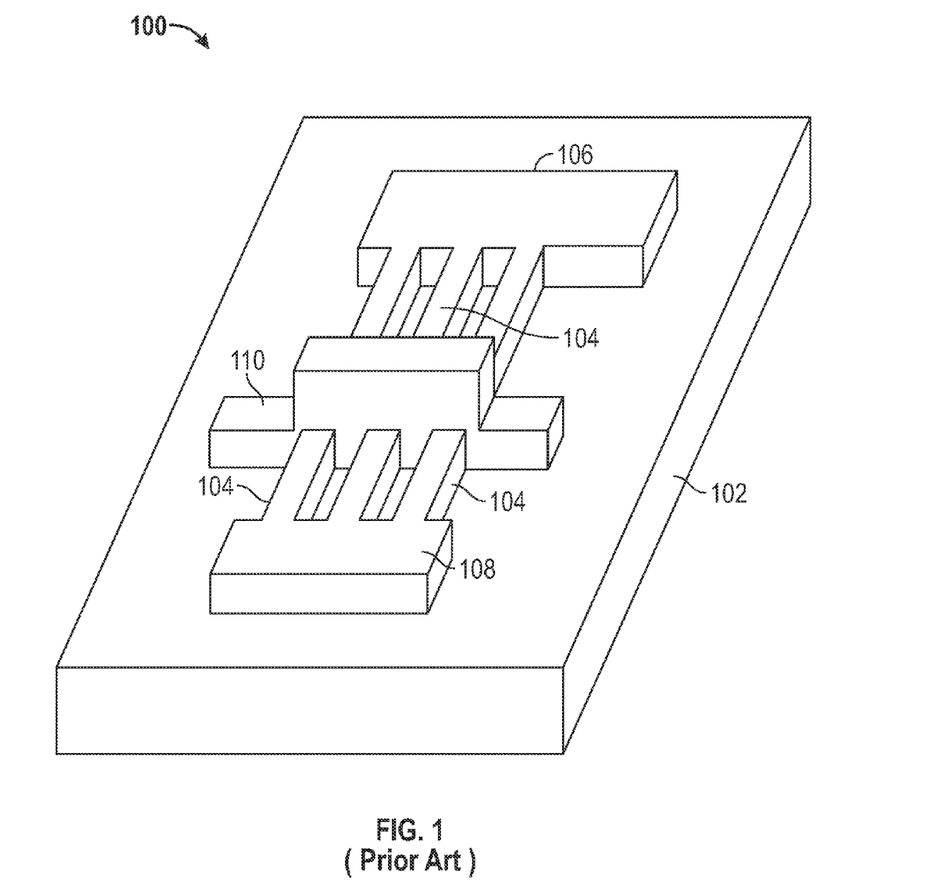
FIG. 1 is an isometric schematic view of a FinFET structure available in the prior art.

A FinFET is a type of transistor that can be fabricated using very small scale processes. FIG. 1 is a simplified perspective view of a FinFET 100, which is formed on a semiconductor wafer substrate 102. As shown in FIG. 1, each fin 104 extends between a source region 106 and a drain region 108 of FinFET 100. FinFET 100 includes a gate structure 110 that is formed across fins 104. The gate structure 110 typically includes multiple layers of gate electrode (conducting materials) and gate dielectric (high-k) (not shown in FIG. 1). The surface area of the fins 104 in contact with gate structure 110 determines the effective channel of FinFET 100.

Similar to planar transistors, source and drain silicide layers may be formed on the source and drain regions 106, 108 of FinFET 100. However, since the fins 104 of FinFETs such as FinFET 100 are typically narrow, current crowding may occur. In addition, it is difficult to land contact plugs onto the source/drain 106, 108 portions of the fins 104. One known solution to alleviate this problem is the formation of epitaxial semiconductor layers on the fins to increase their volumes using known epitaxy processes.

In one known example, selective epitaxial growth (SEG) technology may be employed. In the prior art, SEG technology has been widely used at 32 nm node and beyond in planar CMOS technology. The SEG is performed on source/drain areas using, for example, SiGe for p-type transistors and Si:C for n-type transistors. SEG is typically performed after poly-silicon gate and spacer formation (in gate first flow processes) or before replacement gate (RMG) formation (in gate last flow processes). SEG is beneficially employed for stress engineering (i.e. to enhance electron mobility) and also for lower source/drain resistance. In known SEG process, silicon atoms only nucleate and grow on a silicon surface (and not on a silicon oxide or nitride surface) by using a single-wafer process chamber (at reduced pressure, for example less than 50 Torr, and at reduced temperature, for example less than 600° C.) with $SiCl_2H_2$ or $SiCl_4/H_2$, for example, as precursor gases. The precursor gasses can also be mixed with some percentage of germanium for SiGe growth, or dopants (e.g., C, B, P, and/or As) for in-situ doping.

Figure 2:
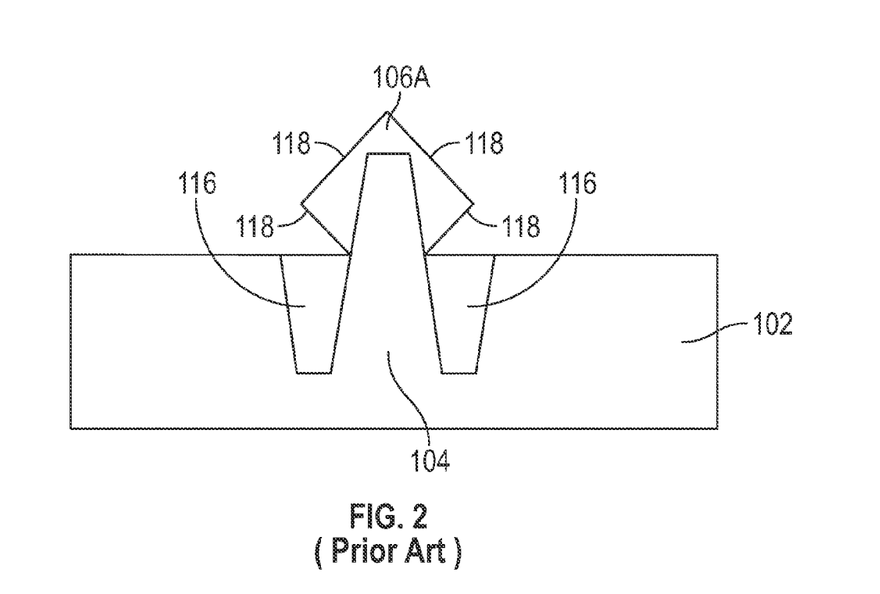
FIG. 2 illustrates a cross-sectional view of an epitaxial layer grown from a semiconductor fin.
Figure 3:
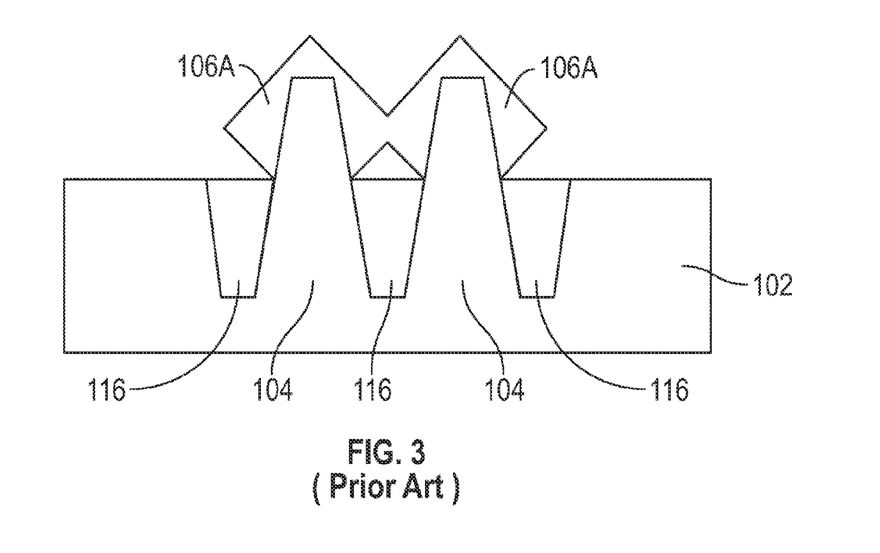
FIG. 3 illustrates the merging of the epitaxial source/drain layers grown from neighboring fins, wherein voids are generated when the epitaxy layers merge.

The epitaxial processes (SEG), however, suffer from drawbacks. FIG. 2 illustrates a cross-sectional view of a semiconductor structure including source (or alternatively drain) region (which also includes part of the original fin 104) and epitaxy layer 106a epitaxially grown on the source/drain region at fin 104. In contrast to conventional planar devices, the volumes of source/drain regions are not confined by shallow trench isolation (STI) regions 116. Since epitaxy layer 106a may have a growth rate smaller on (111) planes than on other planes, the outer surface of epitaxy layer 106a may not have a rectangular (or near-rectangular) profile as that of the original fin 104. Instead, epitaxy layer 106a may extend laterally and form facets 118 (typically the (111) plane of Si). This may cause a reduction in the distance between epitaxy layers grown from neighboring fins, as becomes more apparent in FIG. 3 wherein two fins are illustrated. Accordingly, the amount of SEG in which the epitaxially grown layers growing from neighboring fins will not merge is reduced.

Figure 4:
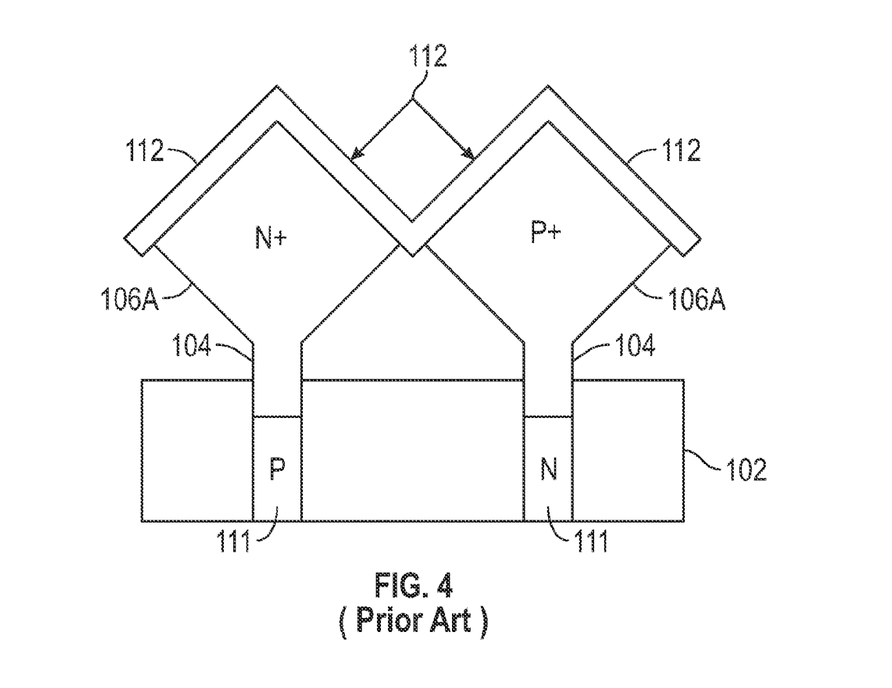
FIG. 4 illustrates merged source/drain areas between n- and p-type fins, with a silicide layer formed thereover.

Again, the exposed source/drain region of the fins, using SEG in a FinFET architecture, is grown larger (laterally and vertically) into diamond shape due to slower epitaxial silicon growth on the (111) surface. Thus, for a given fin-pitch, there is a trade-off between the amount of SEG able to be grown on the source/drain regions (for stress engineering and low resistance) and the amount of spacing adjacent to the source/drain regions of the fins (for avoiding electrical short). Referring to FIG. 4, this problem becomes particularly apparent in the context of alternatively doped adjacent fins, after a silicide layer 112 is deposited. As shown therein, a short would result due to the adjacency of the silicide layer 112 over neighboring n-type and p-type doped source/drain regions.

One solution to this problem know in the prior art describes methods to control the source/drain profile after SEG by performing an in-situ etch cycle (by adding etching gases, e.g. HCl) in the same SEG chamber without breaking the vacuum. See Su et al., United States Patent Application Publication no. 2011/0210404 A1, published on Sep. 1, 2011, and entitled "Epitaxy Profile Engineering for FinFETs." As illustrated therein, just two cycles of SEG-etch-SEG-etch can result in ellipse shape (or egg shape) of the fins, and desirably result in smaller lateral growth in subsequent SEG steps.

Accordingly, it is desirable to provide improved methods of manufacturing semiconductor integrated circuits having FinFET structures with epitaxially formed source and drain regions. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Methods of manufacturing semiconductor integrated circuits having FinFET structures with epitaxially formed source and drain regions. In accordance with an exemplary embodiment, a method of fabricating an integrated circuit includes forming a plurality of silicon fin structures on a semiconductor substrate, forming disposable spacers on vertical sidewalls of the fin structures, and depositing a silicon oxide material over the fins and over the disposable spacers. The method further includes anisotropically etching at least one of the fin structures and the disposable spacers on the sidewalls of the at least one fin structure, thereby leaving a void in the silicon oxide material, and etching the silicon oxide material and the disposable spacers from at least one other of the fin structures, while leaving the at least one other fin structure un-etched. Still further, the method includes epitaxially growing a silicon material in the void and on the un-etched fin structure. An un-merged source/drain region is formed in the void and a merged source/drain region is formed on the un-etched fin structure.

In accordance with another exemplary embodiment, a method of fabricating an integrated circuit includes forming a plurality of silicon fin structures on a semiconductor substrate, epitaxially growing a silicon material on the fin structures, wherein a merged source/drain region is formed on the fin structures, and anisotropically etching at least one of the merged source drain regions to form an un-merged source/drain region.

This brief summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Embodiments of the present disclosure are generally directed to methods of manufacturing semiconductor integrated circuits having FinFET structures with epitaxially formed source and drain regions. Broadly speaking, in one embodiment, a method to form either a merged or an un-merged source/drain structure epitaxially over one or more fins includes forming disposable sidewall spacers over the fins before performing the SEG procedures (for directing SEG growth upward only). Broadly speaking, in another embodiment, a method to form an un-merged source/drain structure epitaxially over one or more fins includes performing the SEG procedures and then anisotropically wet or dry etching in the merged area between fins to separate the merged source/drain area. Each embodiment is described in greater detail below. As such, in both embodiments, both the merged and un-merged source/drain areas of fins are readily available at a given fin-pitch, not only for optimizing stress engineering and low resistance but also for optimizing the design of specific logic blocks on the integrated circuit.

Advantageously, the embodiments disclosed herein are simple to execute and can easily be inserted into a typical FinFET flow as a process module. Secondly, the methods described herein preserve the greater amounts of silicon formed by the SEG process but also maintain spacing between adjacent fins (for eliminating electrical shorting). Thirdly, the disclosed methods allow for both merged and un-merged source/drain areas to be readily formed; therefore, these methods optimize not only device performance (among stress engineering, low resistance, and good isolation with no shorting) but also the performance of specific logic blocks in the integrated circuit. Still further benefits will be appreciated by those having ordinary skill in the art based on the following description of exemplary methods.

Figure 5:
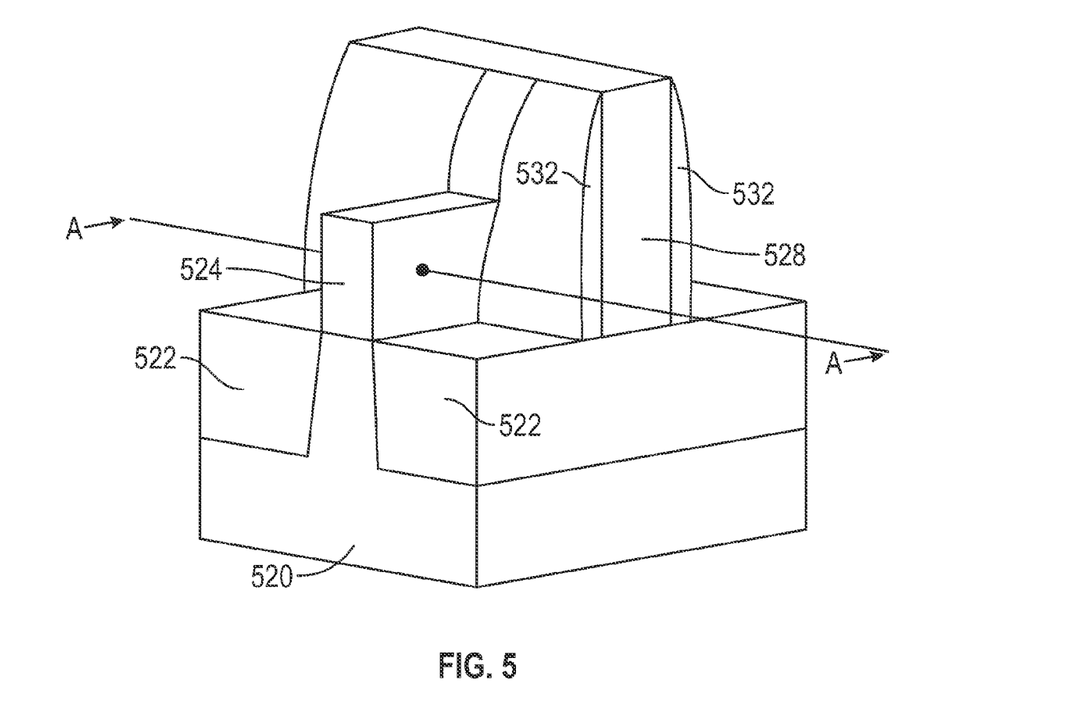
FIG. 5 is a perspective view of an intermediate stage in the manufacturing of a FinFET in accordance with an embodiment.

Reference is now made to FIG. 5, which illustrates conventional procedures in the formation of a FinFET structure prior to performing any SEG procedures. The integrated circuit structure includes substrate 520, which may be a bulk silicon substrate. Substrate 520 may be doped with a p-type or an n-type impurity (see also FIG. 4). Isolation regions, such as shallow trench isolation (STI) regions 522 may be formed in substrate 520. Fin 524 is formed over top surfaces of STI regions 522. In one example, fin 524 may be formed by removing top portions of STI regions 522, so that a portion of substrate 520 between neighboring STI regions 522 becomes a fin. Alternatively, in another example, fin 524 may be formed on top of substrate 520 by an epitaxial growth. Other fin formation methods are known in the art.

In an embodiment, substrate 520 has a surface orientation of (100), and fin 524 extends along the <110> direction. In other embodiments, substrate 520 may have other surface orientations such as (110), in which case fin 524 may extend in directions such as <100>. A gate dielectric (not shown), which may be formed of silicon oxide, high-k dielectric materials, or the like, is formed on the top surface and sidewalls of fin 524. Gate electrode 528 is formed on the gate dielectric. Gate spacers 532 are formed on the sidewalls of gate electrode 528. As noted above, the methods described herein can be inserted as a process module into a typical bulk-FinFET process flow, the beginnings of which are illustrated by way of example in FIG. 5.

For the sake of brevity, further details of the conventional techniques related to FinFET semiconductor device fabrication are not described in detail herein. Moreover, the various tasks and process steps described herein may be incorporated into a more comprehensive procedure or process having additional steps or functionality not described in detail herein. In particular, various steps in the manufacture of semiconductor based transistors are well known and so, many conventional are only be mentioned briefly herein or are omitted entirely without providing the well-known process details. As such, the embodiments described herein, again for the sake of brevity, commence discussion after the fin and gate structures have been formed, as illustrated in FIG. 5.

In the subsequent discussion, cross-sectional views are used to explain the concept of the embodiments. Unless specified otherwise, the cross-sectional views are obtained in vertical planes (referred to as source/drain planes hereinafter) crossing lines at the same position as line A-A in FIG. 5. It is noted that line A-A crosses the (to-be-formed) source/drain region, but not gate electrode 528.

Figure 6:
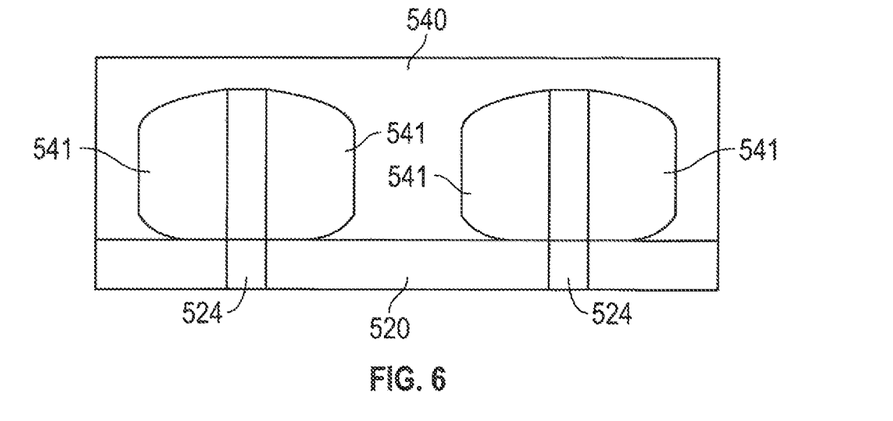
FIGS. 6-10 illustrate a method for epitaxially forming the source/drain regions in a FinFET structure in accordance with one embodiment.

As noted above, in one embodiment, both merged and un-merged source/drain regions may be formed advantageously by depositing a disposable spacer over the fins prior to the performance of any SEG procedures. With reference now to FIG. 6, after the conventional gate patterning and etching described above, a disposable spacer layer 541 is formed on the sidewalls of the fins 524. The disposable spacer layer 541 can be, for example, amorphous carbon or silicon nitride. Methods for forming sidewall spacers with these materials are well known in the art. Thereafter, a blanket layer of silicon oxide 540 or other dielectric material is blanket deposited over the substrate, including over the fins 524 and over the sidewall spacers 541. The layer 540 may be deposited by, for example, chemical vapor deposition (CVD) or other known method, and also planarized by Chemical-Mechanical-Polish (CMP) as illustrated in FIG. 6.

Figure 7:
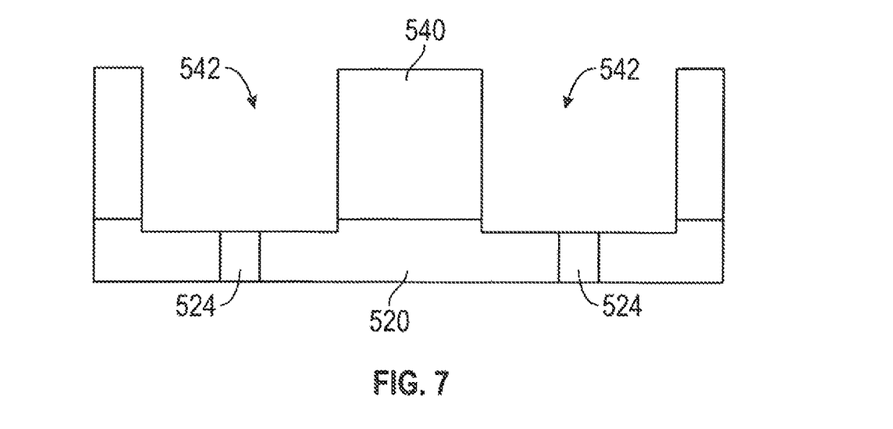

Thereafter, with reference now to FIG. 7, a masking layer is patterned (via known photoresist/lithography procedures, for example) on the surface of the layer 540 (not shown). In particular, the pattern is formed such that only the fins 524 that are desired to have un-merged source/drain regions remain un-masked. In this manner, when an anisotropic etching step is performed to etch-back the material beneath the un-masked regions, the fins 524 and the disposable spacer material is removed to leave voids 542, as illustrated in FIG. 7. Suitable anisotropic etchants are well-known in the art.

Figure 8:
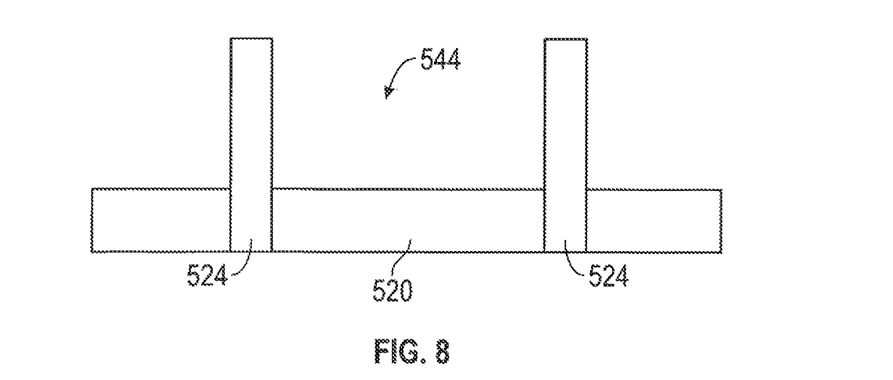

The non-etched fins (and disposable spacers associated therewith) which were masked during the aforementioned anisotropic etching step remain in place. These remaining fins are the fins that are desired to have merged source/drain regions. Thereafter, the masking layer may be removed, and a subsequent masking layer may be deposited over the oxide layer 540 adjacent to voids 542 (FIG. 7), followed by removal of the oxide layer and the disposable spacers 541 surrounding the remaining fins, as shown in FIG. 8. In one example, HF can be used to remove the disposable spacers 541 without etching and of the fins 524. In this manner, there is a complete void 544 between adjacent fins 524 that are desired to have merged source/drain regions.

It will be appreciated that, although the fins 524 that are to have masked and un-masked source/drain regions are illustrated separated in FIGS. 7 and 8, respectively, patterning and masking can be performed so as to form any combination of the fins 524 shown in FIGS. 7 and 8 on any given integrated circuit.

Figure 9:
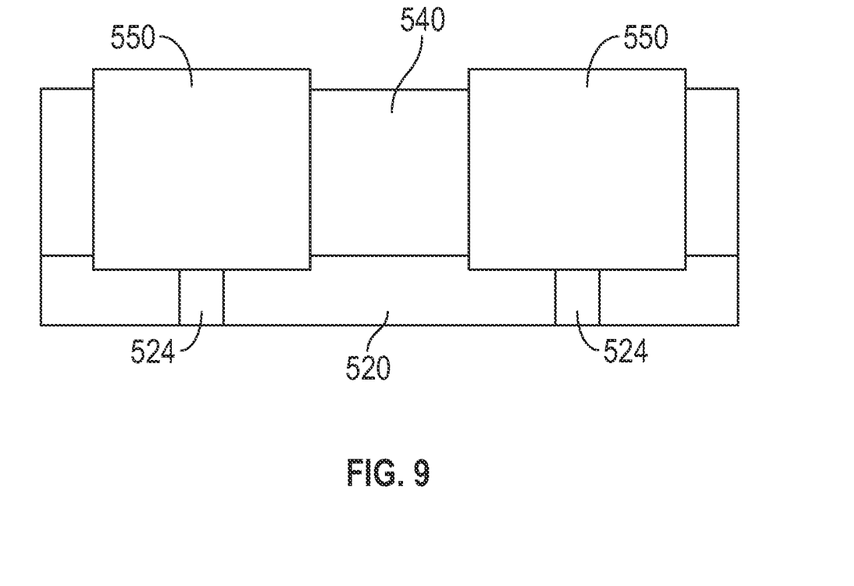
Figure 10:
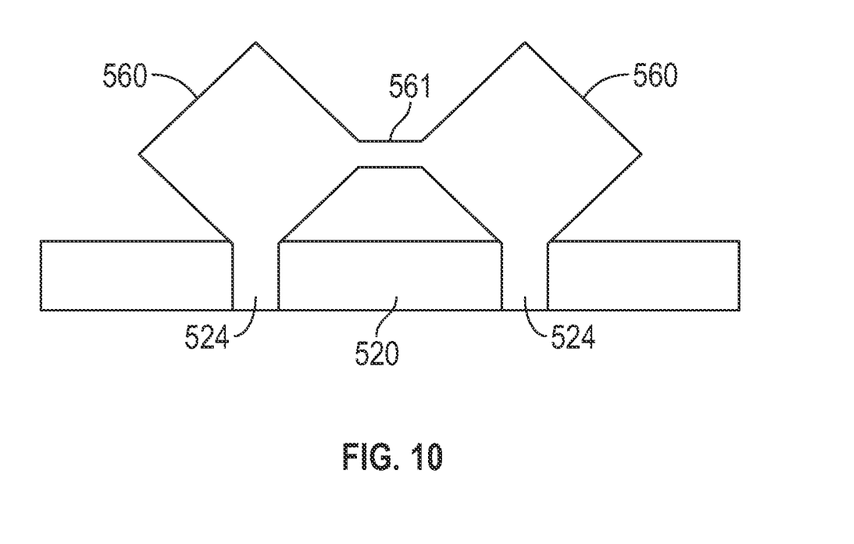

Turning now to FIGS. 9 and 10, conventional SEG procedures are thereafter performed. In areas where the spacers 541 and fins 524 have been removed between the remaining oxide layer 540 (i.e., the voids 542 shown in FIG. 7), epitaxial silicon is grown in a confined manner in the voids 542 as shown in FIG. 9. The result is rectangular shaped source/drain regions 550 that are un-merged. In areas where the fins 524 remain and the oxide layer 540 has been removed (i.e., the complete void 544 shown in FIG. 10), epitaxial silicon is grown in the traditional diamond shape, as discussed above. The result is the traditional merged source/drain regions 560 (area of merger shown as 561). In this manner, about the same amount of epitaxial silicon can be grown in both merged and un-merged areas, desirably resulting in optimal stress and resistance characteristics in the source/drains regions, irrespective of whether the source/drain regions are merged or un-merged. The sidewalls of un-merged fins are (110) orientation at the surface and are spaced apart from adjacent fins. The merged fins have diamond shape and are (111) orientation at the surface.

Moreover, the steps illustrated in FIGS. 7-10 can be repeated to epitaxially grow source/drain regions with different semiconductor materials on Si substrate, for example, SiGe (with Ge from 10% to 50%), Si:C (with C from 1% to 3%), group III-V (GaAs, InSb), group II-VI (ZnSe, CdS), etc. That is, certain fins 524 will remain masked throughout the first repetition of the steps shown in FIGS. 7-10 when fins of a first material type is grown, and thereafter will be subjected to the described procedures using a material of another type in a subsequent repetition of the steps.

Figure 11A:
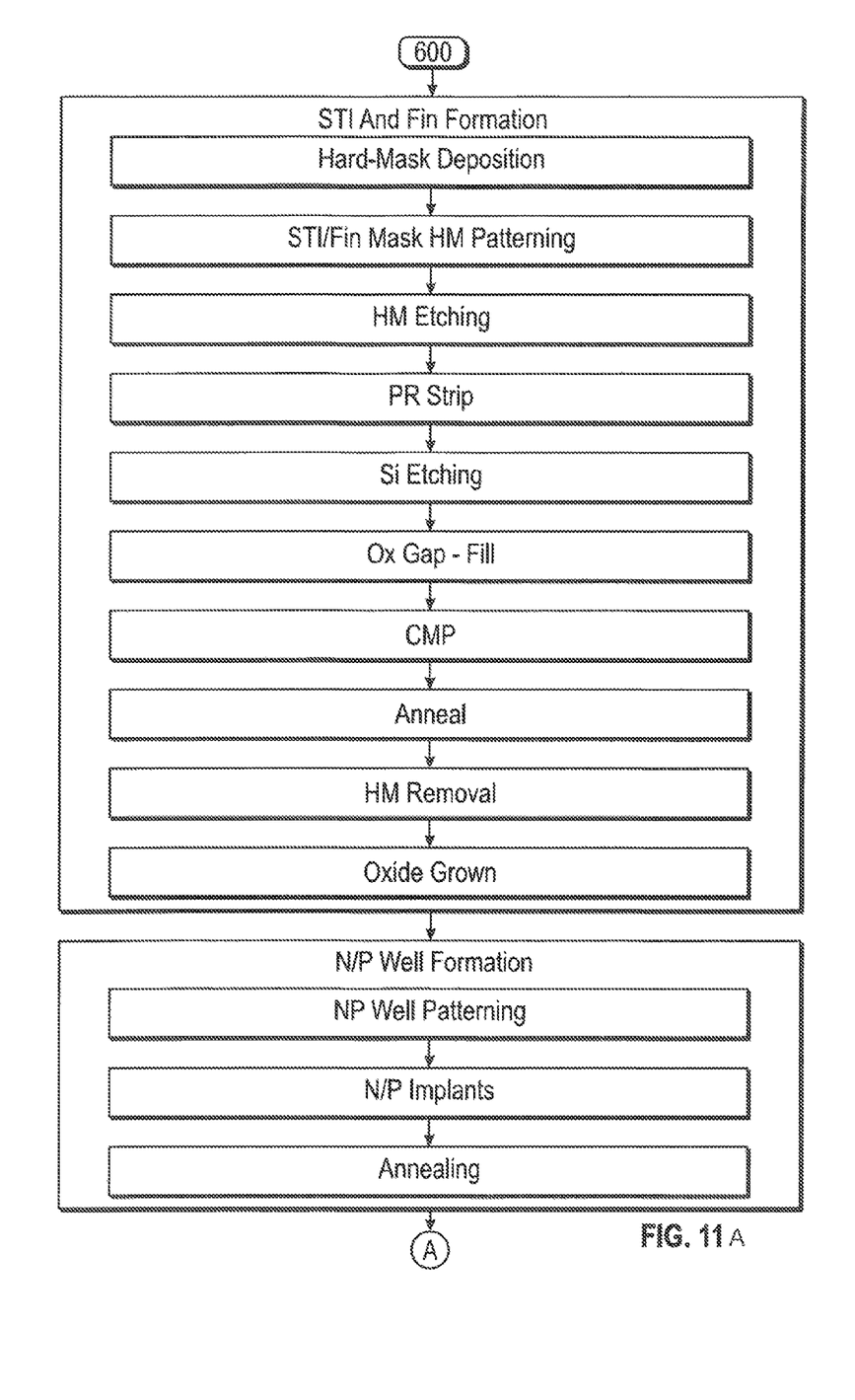
FIGS. 11A-11C provide a flow diagram of the method illustrated in FIGS. 6-10.
Figure 11B:
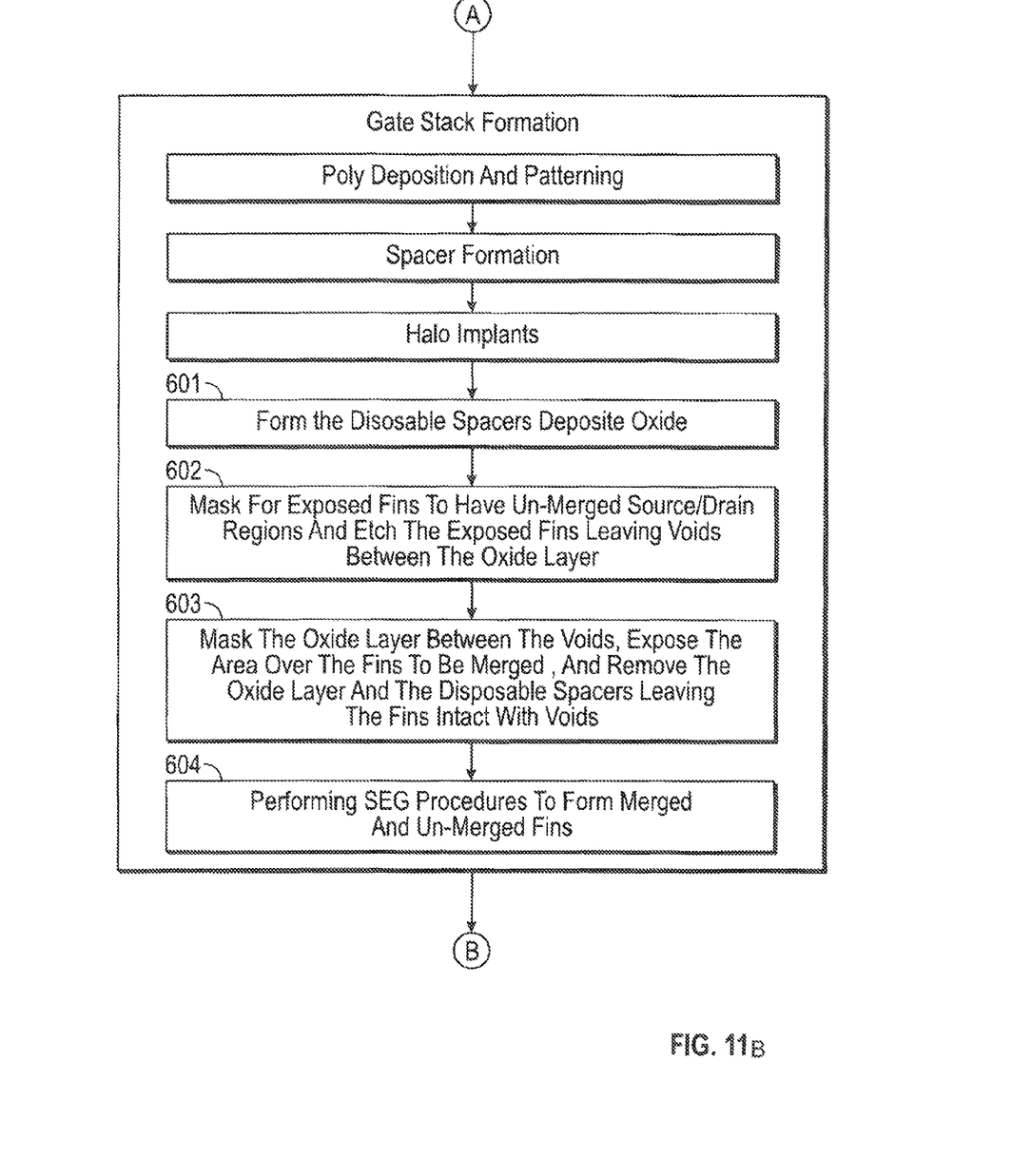
Figure 11C:
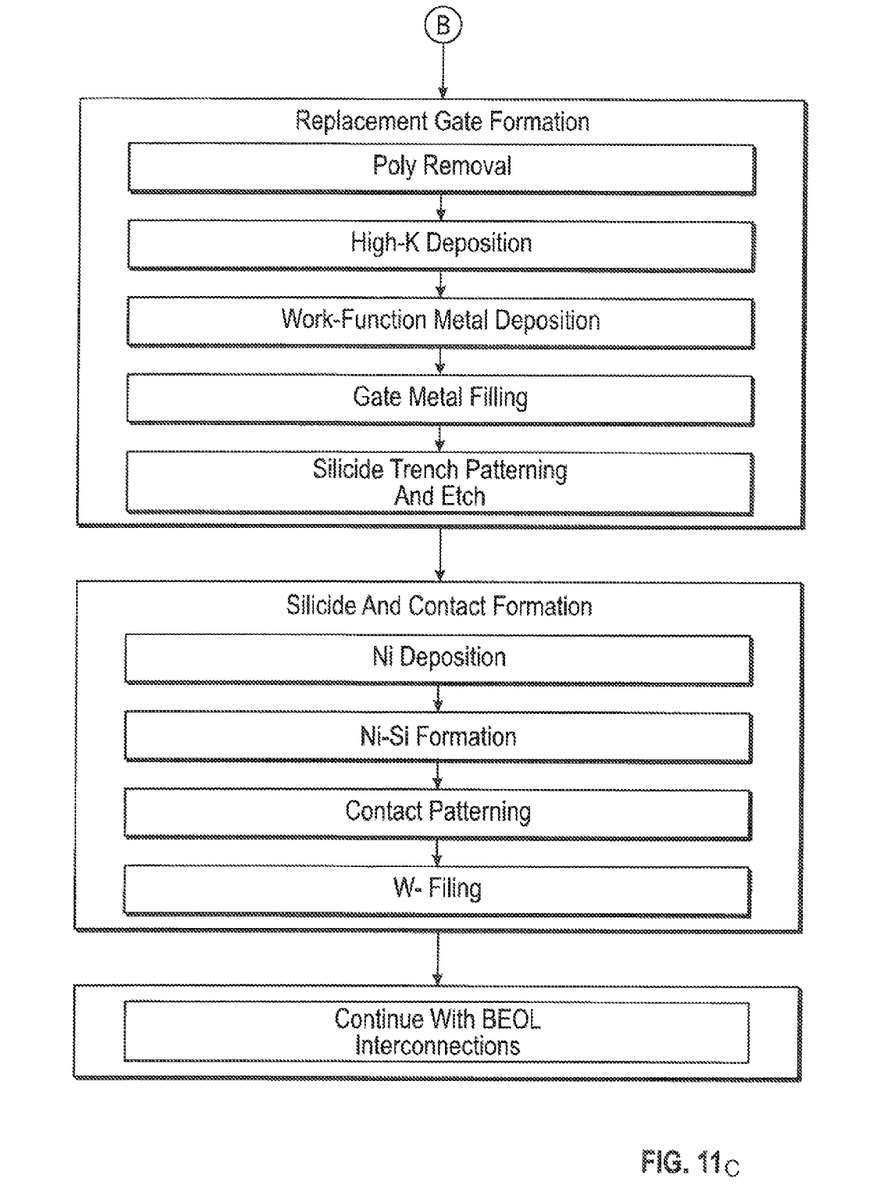

FIG. 11 is a flowchart illustrating a complete process flow that incorporates the procedures set forth above with regard to FIGS. 6-10. In particular, block 600 illustrates a complete conventional FinFET process flow. As all steps shown therein are conventional, the individual steps recited will not be explicated further. As illustrated in FIG. 11, the procedures described above can easily be incorporated into the conventional process flow 600 by replacing the convention p-type/n-type epitaxial source/drain formation steps with steps 601-604, which correspond with the steps illustrated in FIGS. 6-10. Particularly, at step 601, the disposable spacers are formed about the fins, and then the oxide layer is blanket deposited over the substrate. At step 602, a patterned masking layer is deposited, leaving the fins desired to have un-merged source/drain regions formed thereon exposed. The exposed fins are anisotropically etched back, leaving voids between the oxide layer. At step 603, a further masking step is performed to mask the oxide layer between the voids, and exposing the area over the fins that are desired to be merged. For these fins, the oxide layer and the disposable spacers are removed, leaving the fins intact with complete voids formed therebetween. Subsequently, at step 604, the SEG procedures are performed to epitaxially grow silicon. Rectangular, un-merged source/drain regions will be formed in the voids between the remaining oxide layer. Traditional "diamond" shaped, merged source/drain regions will be formed on the fins with complete voids therebetween. Again, steps 602-604 can be repeated where differently doped source/drain regions are desired.

Figure 12:
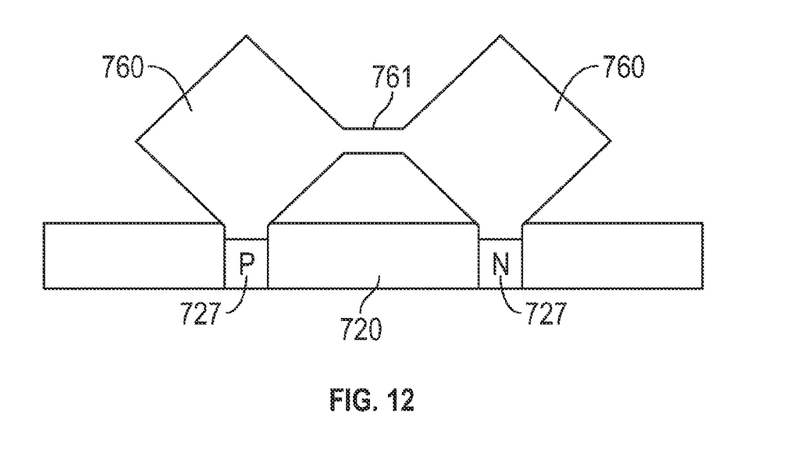
FIGS. 12-14 illustrate a method for epitaxially forming the source/drain regions in a FinFET structure in accordance with another embodiment.

As further noted above, in another embodiment of the present disclosure, un-merged source/drain regions may be formed advantageously by performing the SEG procedures in the conventional manner and then anisotropically wet or dry etching in the merged area between fins to separate the merged source/drain area. An exemplary method is illustrated with regard to FIGS. 12-14. As shown in FIG. 12, a traditional merged source/drain region is first formed on fins 760 using conventional SEG procedures (the area of merger being indicated by 761). The source/drain regions may be differently grown by SEG with various semiconductor materials on the Si fins as illustrated.

Figure 13:
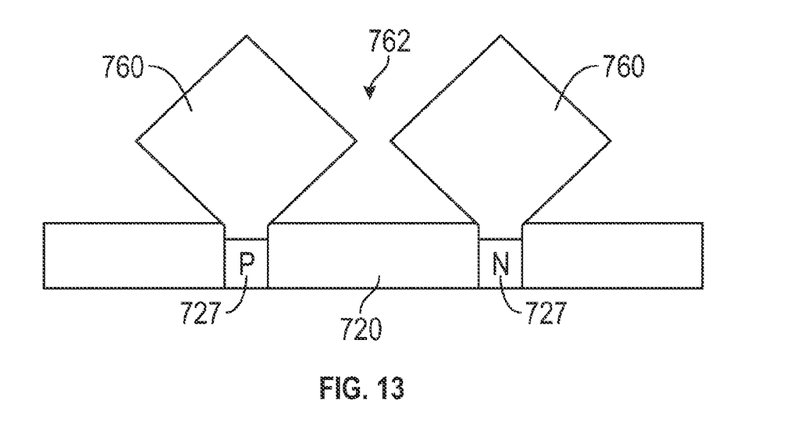

Thereafter, with reference now to FIG. 13, the exemplary method includes patterning a masking layer over the integrated circuit that leaves exposed the source/drain regions that are desired to be un-merged, and particularly the merged areas 761 thereof. A wet anisotropic etch is then performed to separate the merged source/drain region, that is, to etch the merged area 761. In one example, TMAH is suitable as a wet anisotropic etchant of Si. In another example, KOH is suitable as a wet anisotropic etchant of Si. Both TMAH and KOH have an etch rate that is about 10-100 times faster on the Si (100) and (110) surface than on the (111) surface, thereby allowing the merged tips of the "diamond" shape to be separated (area 762 of FIG. 13) without detrimentally etching much of the other portions (111) surface of the source/drain regions.

Figure 14:
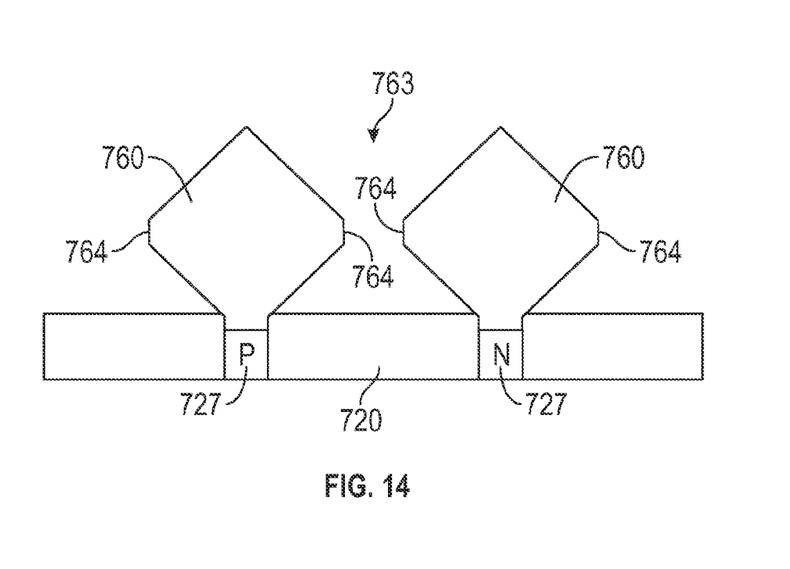

Thereafter, a dry etching procedure is employed to widen the spacing between the now un-merged source/drain region, as shown in FIG. 14 (area 763), with the "diamond" shape also etched and down-sized accordingly. Suitable dry etching procedures are known in the art, such as a plasma etching based on Fluorine chemistry in one example.

Figure 15A:
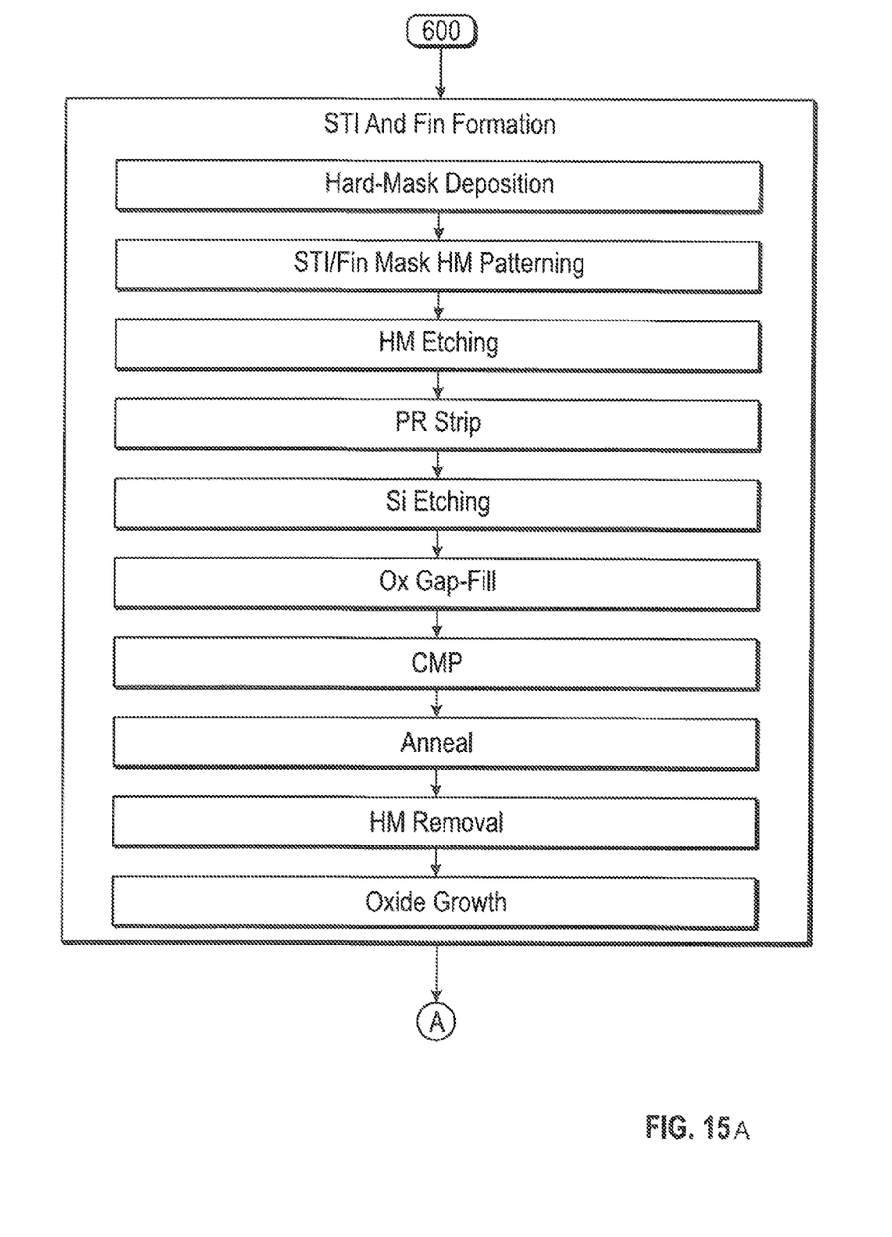
FIGS. 15A-15C provide a flow diagram of the method illustrated in FIGS. 12-14.
Figure 15B:
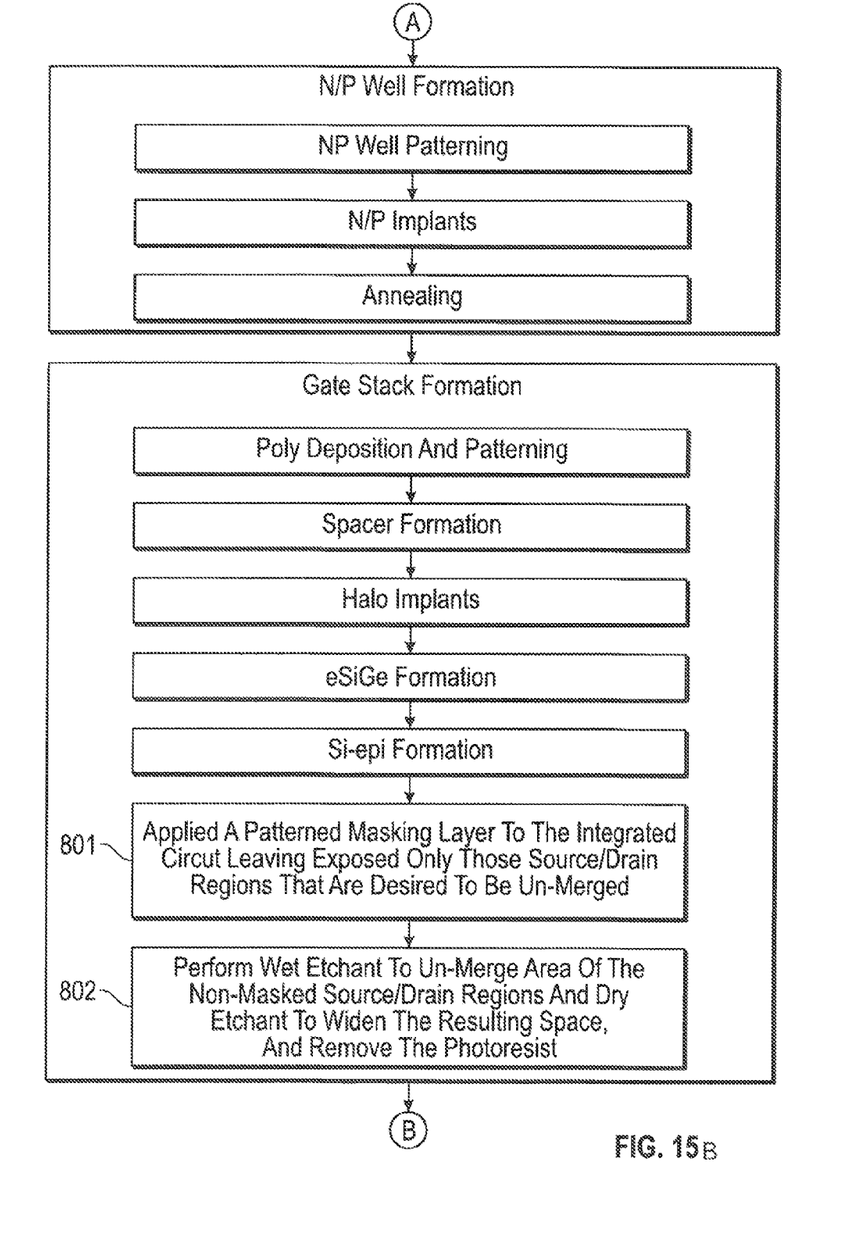
Figure 15C:
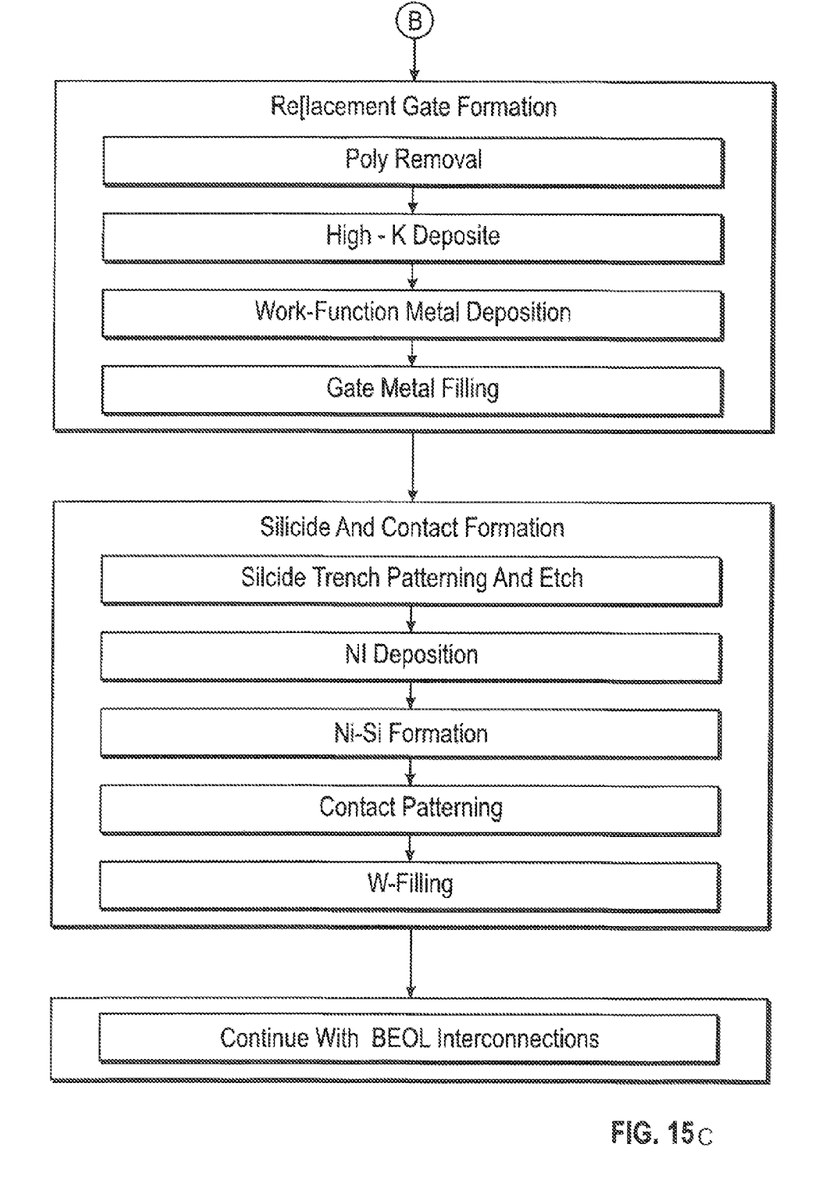

Beneficially, this method does not add any thermal cycles to the conventional base-line flow and also both the "merged" and "un-merged" source/drain areas are formed on the same integrated circuit for optimizing logic blocks. As shown in the flow diagram in FIG. 15, the exemplary method steps 801-802 may simply be inserted into the conventional process flow 600 after the convention p-type/n-type epitaxial source/drain formation steps. Particularly, at step 801, a patterned masking layer is applied to the integrated circuit, leaving exposed only those source/drain regions that are desired to be un-merged. Thereafter, at step 802, an anisotropic wet etchant, such as TMAH or KOH is applied to un-merge the merged area of the non-masked source/drain regions, in the manner noted above. Further, a dry etchant can be employed to widen the resulting space, to a desired width.

Thereafter, further processing steps can be performed to complete the fabrication of the integrated circuit, as are well-known in the art. Further steps conventionally include, for example, further etching of the gate structures, the formation of contacts, and the formation of one or more patterned conductive layer across the device with dielectric layers therein-between, among many others. In this regard, reference can be made to block 600 of either FIG. 11 or FIG. 15, which shows the steps in a convention FinFET fabrication flow process. The subject matter disclosed herein is not intended to exclude any subsequent processing steps to form and test the completed integrated circuit as are known in the art.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope as set forth in the appended claims and their legal equivalents.

What is claimed is:

1. A method of fabricating an integrated circuit comprising:
    forming a plurality of silicon fin structures on a semiconductor substrate;
    forming disposable spacers on vertical sidewalls of the fin structures;
    depositing a silicon oxide material over the fins and over the disposable spacers;
    forming a first patterned masking layer over the silicon oxide material, wherein regions over fins that are desired to have un-merged source/drain regions are left un-masked;
    subsequent to forming the first patterned masking layer, anisotropically etching at least one of the fin structures and the disposable spacers on the sidewalls of the at least one fin structure, thereby leaving a void in the silicon oxide material;
    forming a second patterned masking layer over the silicon oxide material, wherein regions over fins that are desired to have merged source/drain regions are left un-masked;
    subsequent to forming the second patterned masking layer, etching the silicon oxide material and the disposable spacers from at least one other of the fin structures, while leaving the at least one other fin structure un-etched; and
    epitaxially growing a doped silicon material in the void and on the un-etched fin structure, wherein an un-merged source/drain region is formed in the void and a merged source/drain region is formed on the un-etched fin structure,
    wherein the method steps, with the exception of forming the plurality of fin structures, are integrated into a conventional FinFET process flow by replacing conventional p-type/n-type epitaxial source/drain formation steps with said method steps.

2. The method of claim 1, wherein forming disposable spacers comprises forming disposable spacers comprising amorphous carbon.

3. The method of claim 1, wherein forming disposable spacers comprises forming disposable spacers comprising silicon nitride.

4. The method of claim 1, wherein etching the silicon oxide material comprises etching with HF.

5. The method of claim 1, wherein the un-merged source/drain region is substantially rectangular in shape.

6. The method of claim 1, wherein the merged source/drain region is substantially diamond in shape.

7. The method of claim 1, further comprising repeating the steps of anisotropically etching at least one of the fin structures, etching the silicon oxide material and the disposable spacers from at least one other of the fin structures, epitaxially growing a silicon material in the void and on the un-etched fin structure, wherein for each repetition, a differently doped silicon material is epitaxially grown.

* * * * *